(12) United States Patent
Schuetz

(10) Patent No.: US 8,637,984 B2
(45) Date of Patent: Jan. 28, 2014

(54) MULTI-CHIP PACKAGE WITH PILLAR CONNECTION

(75) Inventor: Roland Schuetz, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 241 days.

(21) Appl. No.: 13/088,817

(22) Filed: Apr. 18, 2011

(65) Prior Publication Data

US 2011/0298128 A1 Dec. 8, 2011

Related U.S. Application Data

(60) Provisional application No. 61/352,624, filed on Jun. 8, 2010.

(51) Int. Cl.
*H01L 23/48* (2006.01)
*H01L 21/58* (2006.01)

(52) U.S. Cl.
USPC ............. 257/738; 257/E23.01; 257/E21.505; 257/774; 257/737; 257/531; 438/108; 438/109; 438/29; 438/127

(58) Field of Classification Search
USPC ............ 257/738, E23.01, E21.505, 774, 737, 257/531, 44; 438/109, 108, 29, 127
See application file for complete search history.

(56) References Cited

U.S. PATENT DOCUMENTS

| | | | |
|---|---|---|---|
| 5,422,435 A * | 6/1995 | Takiar et al. | 174/521 |
| 5,963,794 A * | 10/1999 | Fogal et al. | 438/108 |
| 7,737,563 B2 | 6/2010 | Su et al. | |
| 2008/0083985 A1 | 4/2008 | Lee et al. | |
| 2010/0001391 A1 | 1/2010 | Do et al. | |
| 2010/0044861 A1 | 2/2010 | Chiu et al. | |
| 2010/0270668 A1 | 10/2010 | Marcoux | |
| 2011/0227216 A1 * | 9/2011 | Tseng et al. | 257/737 |

* cited by examiner

*Primary Examiner* — Cathy N Lam
(74) *Attorney, Agent, or Firm* — Harvey Auerback

(57) ABSTRACT

A semiconductor device has a substrate having a first plurality of substrate bonding pads disposed on a bonding surface thereof. A plurality of semiconductor dice is disposed on the substrate. Each die of the plurality of dice has a first plurality of die bonding pads arranged along at least one first edge thereof. A plurality of bonding pillars extends substantially vertically from the substrate bonding pads. Each bonding pillar electrically connects one of the first plurality of substrate bonding pads to a corresponding one of the first plurality of die bonding pads. A method of assembling a semiconductor device is also described.

13 Claims, 10 Drawing Sheets

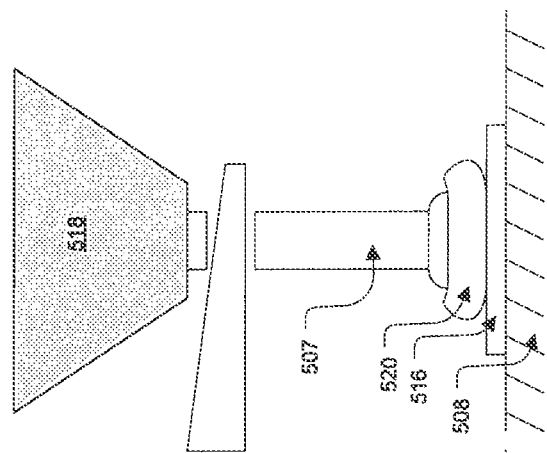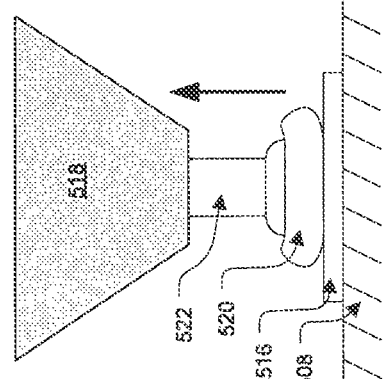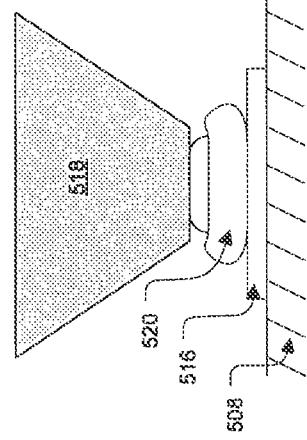

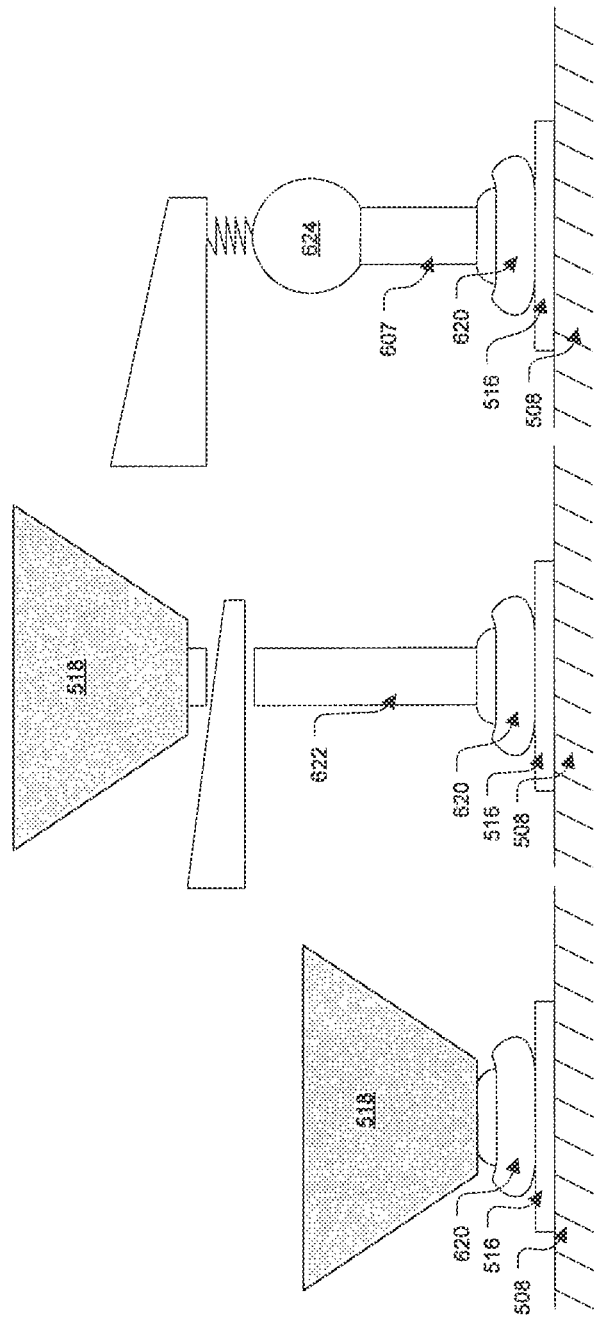

MULTI-CHIP PACKAGE WITH PILLAR CONNECTION

RELATED APPLICATION

This application claims priority to U.S. Provisional Application Ser. No. 61/352,624, which is incorporated by reference herein in its entirety.

FIELD OF THE INVENTION

The invention relates generally to semiconductor memory devices, and more specifically to multi-chip packages.

BACKGROUND

The use of semiconductor integrated circuit chips for data storage, such as portable flash memory cards, is widespread. Users of these devices desire ever-increasing data storage capacity, and manufacturers strive to provide a large storage capacity in a cost-effective manner.

It is known to achieve an increased memory density within a single package by stacking multiple semiconductor chips or dice in a single package, known as a Multi-Chip Package (MCP). The increased number of dice provides a corresponding increase in storage capacity relative to a single die. Referring to FIG. 1, the MCP 100 consists of four NAND Flash memory dice 102. It should be understood that this method is equally applicable to other memory devices and to any number of stacked dice. Each die 102 has bonding pads 104 that are electrically connected via bonding wires 106 to a common substrate 108. Although the dice 102 are shown with bonding pads 104 on two opposite sides, it should be understood that each die 102 may alternatively have a different arrangement of bonding pads 104, for example on a single side, or on two adjacent sides, or any other arrangement. The substrate 108 provides further electrical connections from the bonding wires 106 to solder balls 110 on the opposite side of the substrate 108, forming a Ball Grid Array (BGA) for connection to an external device (not shown). An interposer 112 is provided between each pair of consecutive dice 102, to create a sufficient clearance therebetween to allow the attachment of the bonding wires 106 to the bonding pads 104. This arrangement has the drawback that the thickness of the interposers 112 limits the number of dice 102 that can be stacked within a package of fixed dimensions, thereby limiting the total storage capacity of the MCP 100. In addition, because each die 102 overhangs the bonding pads 104 of the lower dice 102, the bonding wires 106 for each die 102 must be attached prior to stacking the next die 102, resulting in an increased number of manufacturing steps and a time-consuming and labor-intensive assembly.

Another approach is shown in FIG. 2. The MCP 200 consists of four NAND Flash memory dice 202 with bonding pads 204 along one side. It should be understood that this method is equally applicable to other memory devices and to any number of stacked dice. This arrangement may alternatively be used with dice 202 having bonding pads 204 along two adjacent sides, as will be discussed below in further detail. The dice 202 are laterally offset from one another to expose the bonding pads 204 of each die 202. In this arrangement, all of the dice 202 can be stacked in a single step, and thereafter all of the bonding wires 206 can be attached in a single step by a wire bonding machine (not shown). This arrangement does not require interposers to provide access to the bonding pads 204, resulting in a more compact arrangement. This arrangement has the drawback that all of the bonding wires 206 for all dice 202 must be attached along a single side or two adjacent sides of the dice 202 and to the same surface of the substrate 208, because the bonding locations on the opposite side(s) of the dice 202 are covered by the dice 202 above. The resulting higher interconnect density may result in congestion and present logistic difficulties, particularly in devices such as HLNAND™ where each die 202 requires separate interconnect traces on the substrate 208. Alternatively, a reduced number of bonding wires 206 may be used, which may adversely affect the performance of the MCP 200. These drawbacks can be addressed to some extent by providing additional interconnection layers on the substrate 208, which can increase the cost of manufacture.

Another arrangement is shown in FIGS. 3 and 4. Referring to FIG. 3, the MCP 300 has one set of dice 302A in a first orientation and another set of dice 302B in a second orientation. It should be understood that this method is equally applicable to other memory devices and to any number of stacked dice. Each die 302 has bonding pads 304 along one side. The two orientations of the dice 302 allow a 50% reduction in the congestion of bonding wires 306. In FIG. 4, each die 402 is additionally offset in a second direction relative to the dice 302 of FIG. 3, thereby allowing a second set of bonding wires 406 to be connected to a second set of bonding pads 404 on a second side of each die 402, with an attendant increase in interconnect density. The second side is adjacent to the first side. However, in both MCPs 300 and 400 the sides 314, 414 of the dice 302, 402 opposite the bonding pads 304, 404 might not be usable for additional bonding pads. This may be the case even if the dimensions of the dice 302, 402 and any interposers results in a stack geometry such that the sides 314, 414 of the dice 302, 402 are not obstructed by other dice 302, 402 in the stack, for example because the overhanging sides 314, 414 of the dice 302, 402 lack the structural rigidity to withstand the wire bonding operation.

Therefore, there is a need for a Multi-Chip Package having reduced interconnect congestion.

There is also a need for a Multi-Chip Package having an increased number of interconnects per die.

There is also a need for a Multi-Chip Package having a compact arrangement.

There is also a need for a method of assembling a Multi-Chip Package having these characteristics.

SUMMARY

It is an object of the present invention to address one or more of the disadvantages of the prior art.

It is another object of the present invention to provide a Multi-Chip Package wherein multiple chips are stacked on a substrate and electrically connected thereto along at least one edge with bonding pillars extending substantially vertically from the substrate to the chip.

It is another object of the present invention to provide electrical connections between a substrate and one or more edges of a chip that are not ordinarily accessible to conventional bonding wires.

It is another object of the present invention to provide a method of assembling a Multi-Chip Package by forming a plurality of bonding pillars extending substantially vertically away from a substrate, and positioning at least one chip on the substrate such that bonding pads along at least one edge of the at least one chip are in contact with the plurality of bonding pillars, and forming bonding wires connecting bonding pads along at least one other edge of the at least one chip to the substrate.

In a first aspect, a semiconductor device comprises a substrate. A first plurality of substrate bonding pads is disposed on a bonding surface thereof. A plurality of semiconductor dice is disposed on the substrate. Each die of the plurality of dice has a first plurality of die bonding pads arranged along at least one first edge thereof. A plurality of bonding pillars extends substantially vertically from the substrate bonding pads. Each bonding pillar electrically connects one of the first plurality of substrate bonding pads to a corresponding one of the first plurality of die bonding pads.

In a further aspect, the substrate has a second plurality of substrate bonding pads disposed thereon. Each of the plurality of dice has a second plurality of die bonding pads arranged along at least one second edge thereof. A plurality of bonding wires electrically connects each of the second plurality of substrate bonding pads to a corresponding one of the second plurality of die bonding pads.

In a further aspect, the at least one first edge and the at least one second edge are opposite edges of the die.

In a further aspect, each of the first plurality of die bonding pads is disposed on at least a lateral surface of the die.

In a further aspect, each of the second plurality of die bonding pads is disposed on at least a top surface of the die.

In a further aspect, the bonding pillars are connected to the substrate bonding pads via ball bonds.

In a further aspect, the at least one first edge is a single first edge.

In a further aspect, the at least one second edge is a single second edge.

In a further aspect, the at least one first edge is two adjacent first edges.

In a further aspect, the at least one second edge is two adjacent second edges.

In a further aspect, the at least one first edge of at least one die of the plurality of dice overhangs the substrate bonding pads and the bonding pillars connected to at least one other die of the plurality of dice.

In a further aspect, the at least one die of the plurality of dice is spaced apart from a top portion of the bonding pillars connected to at least one other die of the plurality of dice.

In a further aspect, interposers are provided between consecutive ones of the plurality of dice.

In an additional aspect, a method of assembling a semiconductor device, comprises forming a plurality of substantially vertical bonding pillars on a bonding surface of a substrate in electrical connection with a first plurality of substrate bonding pads. A plurality of semiconductor dice is stacked on the bonding surface of the substrate. Each of the plurality of dice has a first plurality of die bonding pads arranged along at least one first edge thereof, such that each of the first plurality of die bonding pads is in proximity of a corresponding one of the plurality of bonding pillars. An electrical connection is formed between each of the plurality of bonding pillars and the corresponding one of the first plurality of die bonding pads.

In a further aspect, the bonding surface of the substrate has a second plurality of substrate bonding pads disposed thereon. Each of the plurality of dice has a second plurality of die bonding pads arranged along at least one second edge thereof. Bonding wires are attached between each of the second plurality of substrate bonding pads and a corresponding one of the second plurality of die bonding pads.

In a further aspect, forming an electrical connection between each of the plurality of bonding pillars and a corresponding one of the first plurality of die bonding pads comprises welding each of the plurality of bonding pillars to the corresponding one of the first plurality of die bonding pads.

In a further aspect, forming an electrical connection between each of the plurality of bonding pillars and a corresponding one of the first plurality of die bonding pads comprises connecting each of the plurality of bonding pillars to the corresponding one of the first plurality of die bonding pads using an electrically conductive epoxy.

In a further aspect, forming each of the plurality of substantially vertical bonding pillars comprises: forming a ball bond on a corresponding one of the first plurality of substrate bonding pads using a wire bonding machine; forming a wire attached to the ball bond and extending generally away from the surface of the substrate; and clipping the wire at a desired distance from the bonding surface of the substrate, thereby to form a bonding pillar of a desired height.

In a further aspect, forming each of the plurality of substantially vertical bonding pillars further comprises forming a ball at an upper end of the wire.

In a further aspect, stacking a plurality of dice comprises positioning at least one die of the plurality of dice such that the first edge of the at least one die overhangs the bonding pillars connected to a previously stacked die.

Additional and/or alternative features, aspects, and advantages of embodiments of the present invention will become apparent from the following description, the accompanying drawings, and the appended claims.

BRIEF DESCRIPTION OF THE DRAWINGS

FIGS. 5A, 5B and 5C are schematic elevation views showing the formation of bonding pillars according to a first embodiment;

FIGS. 6A, 6B and 6C are schematic elevation views showing the formation of bonding pillars according to a second embodiment;

DETAILED DESCRIPTION

Figure 14:
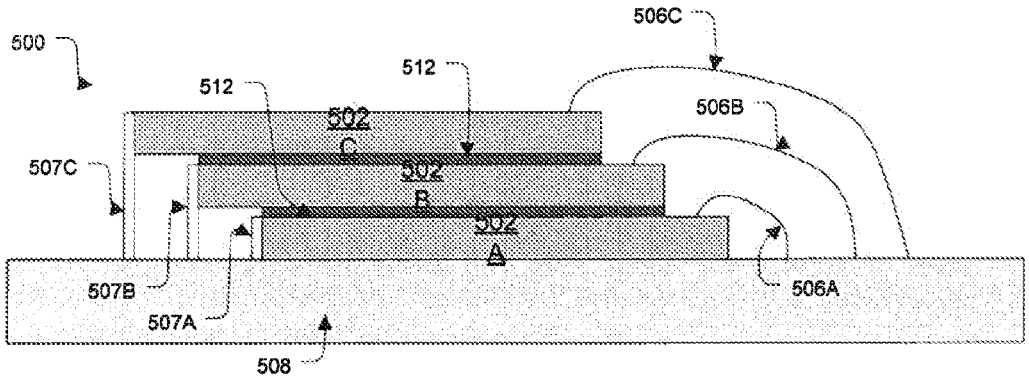
FIG. 14 is a schematic elevation view of a die stack with bonding pillars and bonding wires according to an embodiment.

Referring to FIG. 14, an MCP 500 according to a first embodiment has three dice 502A, 502B, 502C. Each die may be a memory chip, such as a NAND Flash chip. Alternatively, some or all of the dice may be different types of chips, such as controller chips. Each die 502A, 502B, 502C has bonding pads 504A, 504B, 504C (best seen in FIG. 8) along one edge. The bonding pads 504A, 504B, 504C are connected to a bonding surface of the substrate 508 via respective bonding wires 506A, 506B, 506C. Each die 502A, 502B, 502C additionally has bonding pads 505A, 505B, 505C (best seen in FIG. 8), arranged along a second edge, which in this embodiment is opposite the bonding pads 504A, 504B, 504C. The bonding pads 504, 505 may be constructed to wrap around a corner of the die from the top surface to the lateral surface, such that they are able to form electrical contacts either in a lateral direction or on the top surface, as shown in U.S. Pat. No. 5,126,286. The bonding pads 505A, 505B, 505C are connected to the surface of the substrate 508 via respective bonding pillars 507A, 507B, 507C, as will be discussed below in further detail. The bonding pillars 507A, 507B, 507C provide the same communication functionality as the bonding wires 506A, 506B, 506C. A plurality of solder balls (not shown) on the opposite surface of the substrate 508 form a Ball Grid Array (BGA) for connection to an external device. The number and position of the solder balls in the BGA is known in the art and forms no part of the invention. It is contemplated that other known methods of connecting the MCP to an external device may alternatively be used. It should be understood that this arrangement is equally applicable to other memory devices and to any number of stacked dice. Additional features of the MCP 500 should be understood by a person skilled in the art having regard to the method of assembly of the MCP 500, discussed below.

Figure 16:
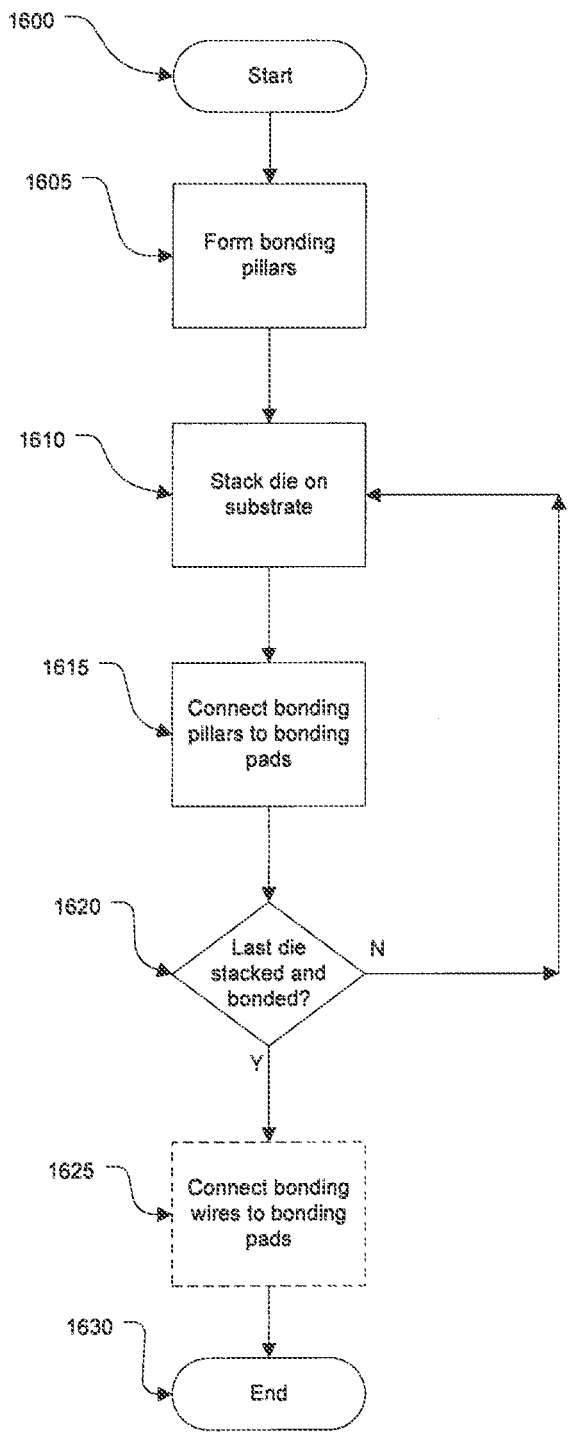
FIG. 16 is a logic diagram of a method of assembly of a die stack according to an embodiment.

Referring to FIG. 16, the assembly of the MCP 500 will be described, beginning at step 1600, with a substrate 508 having an appropriate arrangement of electrical contacts or bonding pads 516 on a bonding surface thereof.

At step 1605, referring to FIGS. 5A, 5B and 5C, a bonding pillar 507 is formed using a wire forming apparatus 518 that may be a conventional wire bonding machine. Referring to FIG. 5A, a ball bond 520 is formed on the bonding pad 516 in a conventional manner. Alternative methods of forming a bond to the bonding pad 516 may be used, as would be understood by a person skilled in the art. Referring to FIG. 5B, the wire forming apparatus 518 is retracted in a direction generally away from the surface of the substrate 508, to form a wire 522 extending generally away from the surface of the substrate 508. Referring to FIG. 5C, the wire 522 is clipped at a desired length to form a bonding pillar 507 of a desired height. At this stage the bonding pillar 507 is bonded only by the ball bond 520 to the bonding pad 516 of the substrate 508, and is not bonded at the upper end.

Referring to FIGS. 6A-6C, an alternative method of forming a bonding pillar 607 is shown. Referring to FIG. 6A, a ball bond 620 is formed on the bonding pad 516 in a conventional manner. Alternative methods of forming a bond to the bonding pad 516 may be used, as would be understood by a person skilled in the art. Referring to FIG. 6B, the wire forming apparatus 518 is retracted in a direction generally away from the surface of the substrate 508, to form a wire 622 extending generally away from the surface of the substrate 508, and the wire 622 is then clipped at a desired length to form a bonding pillar 607 of a desired height. Referring to FIG. 6C, a ball 624 is formed at the top of the bonding pillar 607 in a conventional manner, such as by electronic flame-off. The ball 624 provides additional metal at the top of the bonding pillar 607, which can be used to create a larger contact patch with the bonding pad 505 as will be described below in further detail. The larger contact patch may be desired in forming a high current contact or a reduced resistance contact to the bonding pad 505. It should be understood that the discussion of the bonding pillar 507 herein below can be applied to the bonding pillar 607.

Figure 1:
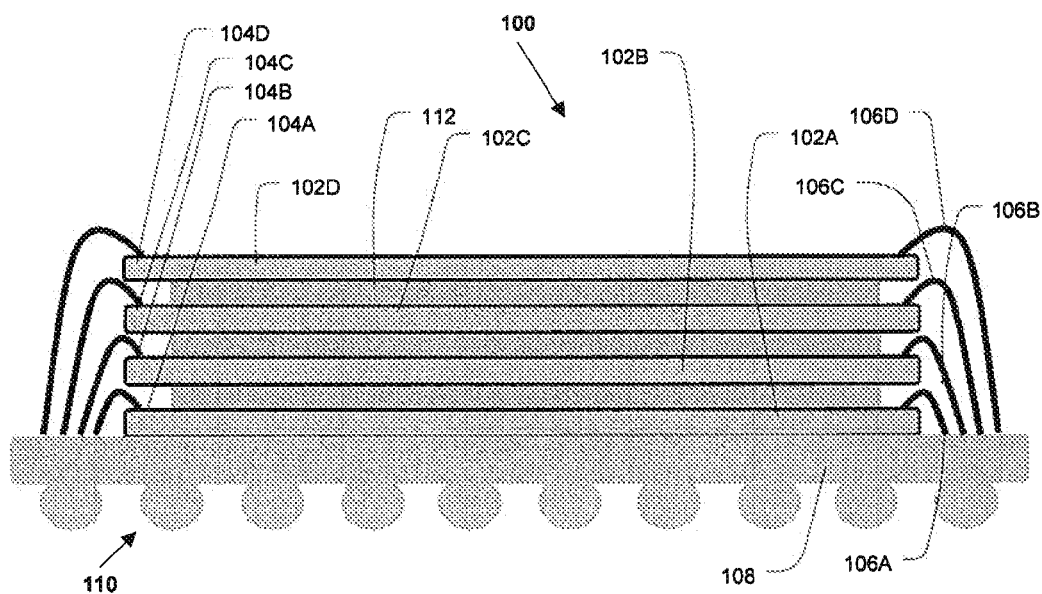
FIG. 1 is a schematic cross-sectional view of a Multi-Chip Package (MCP) according to a first prior art embodiment.
Figure 2:
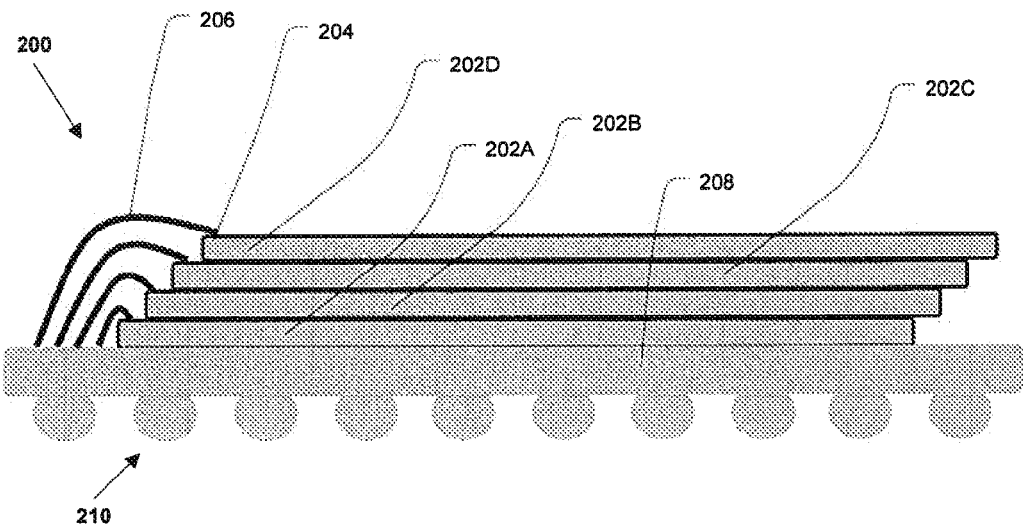
FIG. 2 is a schematic cross-sectional view of a Multi-Chip Package (MCP) according to a second prior art embodiment.
Figure 3:
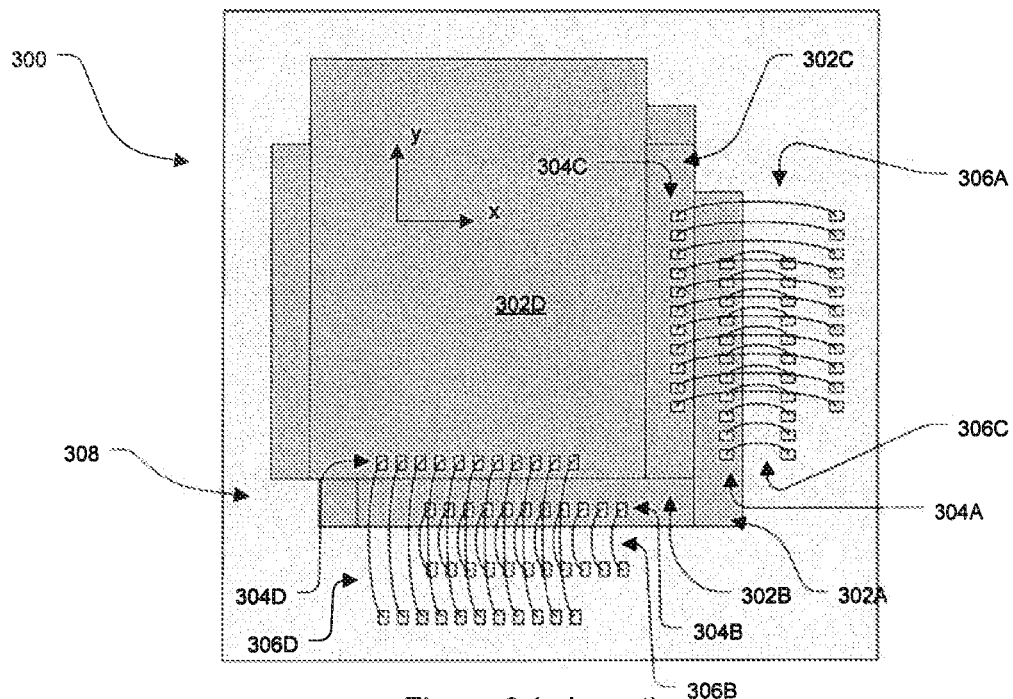
FIG. 3 is a schematic cross-sectional view of a Multi-Chip Package (MCP) according to a third prior art embodiment.
Figure 4:
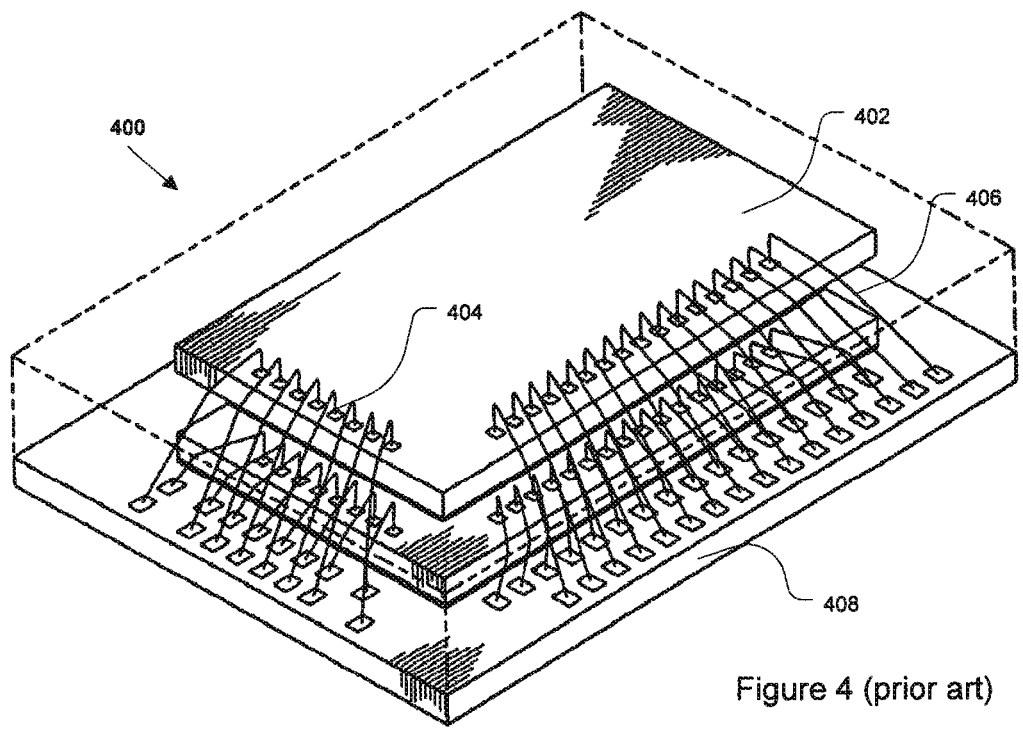
FIG. 4 is a schematic cross-sectional view of a Multi-Chip Package (MCP) according to a fourth prior art embodiment.
Figure 7:
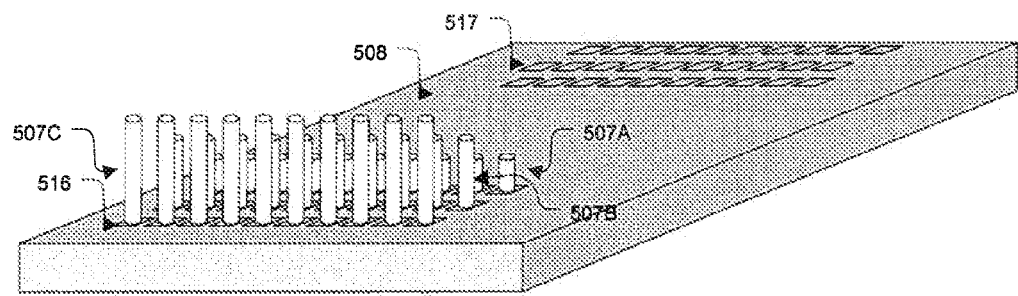
FIG. 7 is a schematic perspective view of an array of bonding pillars according to an embodiment of the present invention.

FIG. 7 shows an array of bonding pillars 507A, 507B, 507C, each of which is formed on the substrate 508 according to the process of FIGS. 5A-5C. Each row of bonding pillars 507A, 507B, 507C has an appropriate height for bonding with a respective one of the dice 502A, 502B, 502C as will be discussed below in further detail. It should be understood that more or fewer rows of bonding pillars 507A, 507B, 507C would be used depending on how many dice 502A, 502B, 502C are desired in the MCP 500. The actual heights of the bonding pillars 507A, 507B, 507C will depend on various factors, such as the thickness of each die and the thickness of any interposers between them. The spacing between consecutive rows of bonding pillars 507A, 507B, 507C corresponds to the lateral offset between consecutive dice 502A, 502B, 502C, which lateral offset is at least sufficient to expose the bonding pads 504A, 504B, 504C for later wire bonding as will be discussed below in further detail.

The bonding pillar 507, 607 in FIGS. 5A-5C and 6A-6C is shown extending perpendicular to the surface of the substrate 508, however it should be understood that the bonding pillar 507, 607 need not be exactly perpendicular to the surface of the substrate 508, as long as all of the bonding pillars 507, 607 bonded to a particular substrate 508 are sufficiently spaced apart from each other to prevent accidental short circuits or other unwanted electrical connections, and the bonding pillars 507, 607 extend far enough from the surface to contact the bonding pads 505 of the appropriate die 502, as will be discussed below in further detail. The expression "substantially vertical" should be understood to encompass all of these permissible orientations. The bonding pillars 507, 607 may be formed of copper to provide stiffness, but any other suitable metal such as gold or aluminum may be used depending on the desired physical and electrical properties for the particular application. The process continues at step 1610.

Figure 8:
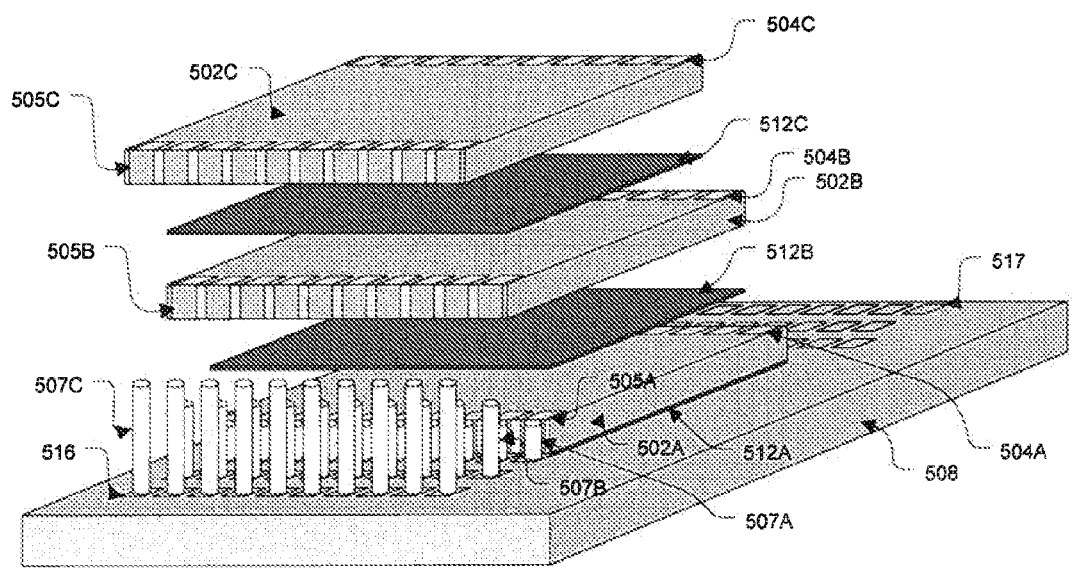
FIG. 8 is a schematic exploded view of a die stack according to an example embodiment.

At step 1610, the first die 502A is stacked on the substrate 508, on top of a spacer or interposer 512A if desired, as shown in FIG. 8. The stacking can be done in a conventional manner, provided that the die 502A is positioned such that the bonding pads 505A are in contact with or in sufficient proximity to the corresponding bonding pillars 507A such that an electrical connection can be formed therebetween, as will be discussed below in further detail. The die 502A may optionally be positioned such that the bonding pads 505A abut and exert a lateral force against the corresponding bonding pillars 507A to form a better electrical connection therebetween, as will be discussed below in further detail. The process continues at step 1615.

Figure 9:
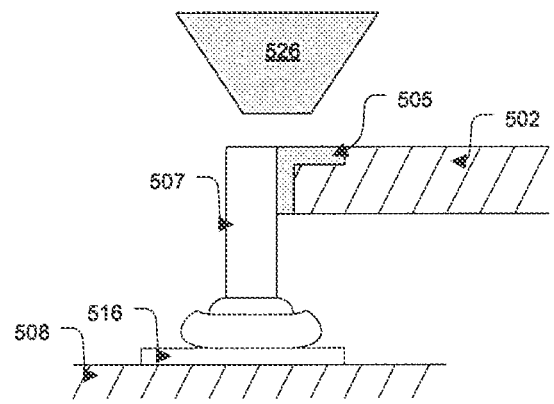
FIG. 9 is a schematic cross-sectional view of a contact formed between a bonding pad and a bonding pillar according to a first embodiment.
Figure 10A:
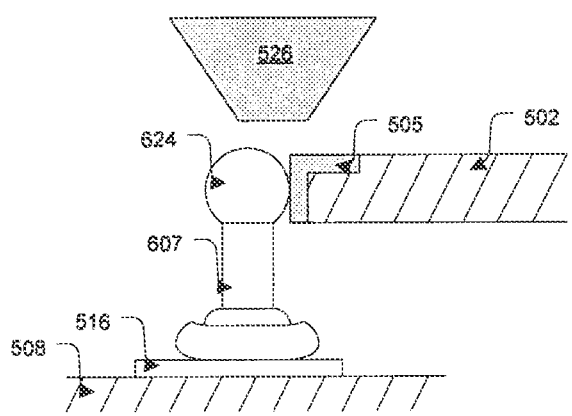
FIGS. 10A and 10B are a schematic view of a contact formed between a bonding pad and a bonding pillar according to a second embodiment.
Figure 10B:
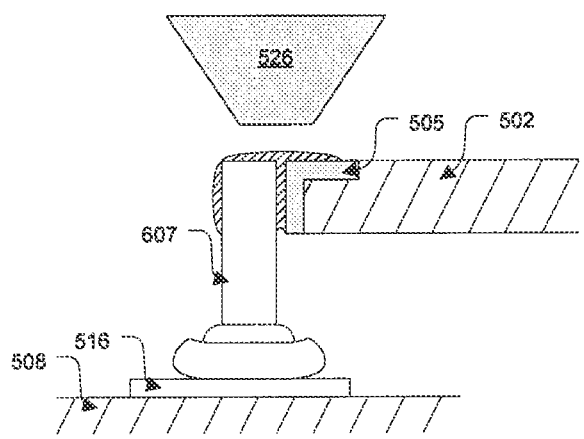
Figure 11A:
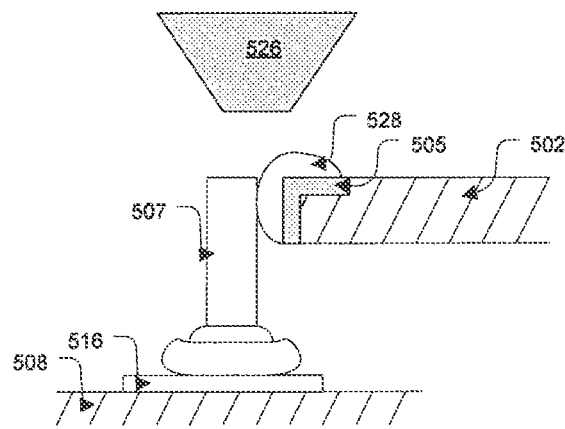
FIGS. 11A and 11B are a schematic view of a contact formed between a bonding pad and a bonding pillar according to a third embodiment.
Figure 11B:
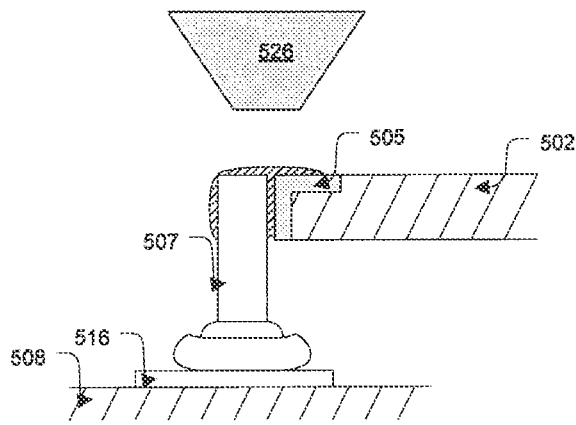

At step 1615, an electrical connection is formed between a top portion of each bonding pillar 507A and a corresponding bonding pad 505A. This connection may be formed by any suitable method. Referring to FIG. 9, according to one embodiment the die 502A is positioned on the substrate 508 such that each bonding pad 505A applies a horizontal pressure to its corresponding bonding pillar 507A, or alternatively such that the bonding pads 505A and the corresponding bonding pillars 507A are in close proximity. The connection is formed by bonding each bonding pillar 507A to the corresponding bonding pad 505A using a laser welding apparatus 526 or other suitable device. Referring to FIGS. 10A and 10B, according to an alternative embodiment the die 502A is positioned on the substrate 508 such that each bonding pad 505A applies a horizontal pressure to the ball 624 of its corresponding bonding pillar 607A, or alternatively such that the bonding pads 505A and the corresponding bonding pillars 607A are in close proximity. The connection is formed by bonding each bonding pillar 607A to the corresponding bonding pad 505A using a laser welding apparatus 524 or other suitable device. Referring to FIGS. 11A and 11B, according to an alternative embodiment the bonding pads 505A each have a bump 528 formed thereon. The bump 528 may be formed in any known manner, such as the manner described in U.S. Pat. No. 6,410,406, the contents of which are incorporated by reference herein in their entirety. The die 502A is positioned on the substrate 508 such that each bump 528 applies a horizontal pressure to its corresponding bonding pillar 507A, or alternatively such that the bonding pads 505A and the corresponding bonding pillars 507A are in close proximity. The connection is formed by bonding each bonding pillar 507A to the corresponding bonding pad 505A using a laser welding apparatus 524 or other suitable bonding device. It is contemplated that other methods of forming the connection between the bonding pillars 507A and the bonding pads 505A, such as an electrically conductive epoxy. The process continues at step 1620.

Figure 12:
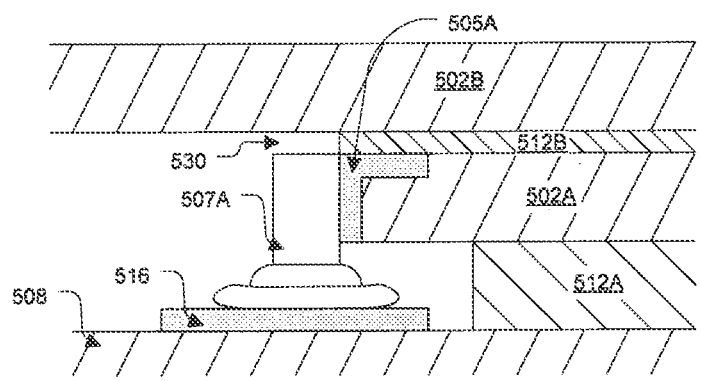
FIG. 12 is a schematic cross-sectional view of a bonding pillar and a surrounding portion of a die stack.

At step 1620, if the last die 502 has been stacked and bonded to the substrate 508, the process continues at step 1625. If there are more dice 502 to be stacked and bonded to the substrate 508, the process returns to step 1610 to stack an additional die 502. Each die 502 is laterally offset from the dice 502 below, both to ensure proper bonding to the bonding pillars 507 and to expose the bonding pads 504 on the upper surface of the die 502 below. Referring to FIG. 12, spacers 512 may be used to provide sufficient clearance between the first die 502A and the substrate 508 that the contact between the die 502A and the bond pillars 507A is not obstructed by the ball bond 520. The spacers 512 may additionally be used to provide sufficient clearance between successive dies 502A, 502B to form a gap 530 between the bonding pillars 507A corresponding to the lower die 502A and the upper die 502B overhanging the bonding pillars 507A. It should be understood that the gap 530 may be small, and in particular the gap 530 may be smaller than would be required to allow the bonding of a conventional bonding wire in the place of the bonding pillar 507, thereby requiring a thinner spacer 512. In this manner, the entirety of a bonding pillar 507A and its substrate bonding pad 516 may be disposed between the substrate 508 and the overhanging die 502B, resulting in a compact arrangement.

Figure 13:
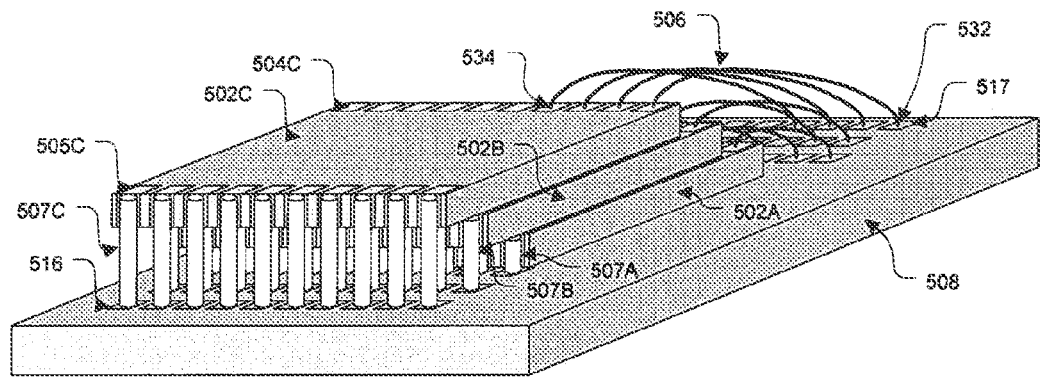
FIG. 13 is a schematic perspective view of a die stack with bonding pillars and bonding wires.

At step 1625, referring to FIG. 13, bonding wires 506 are connected to the bonding pads 517 of the substrate 508 and to the bonding pads 504 of the dice 502 in a known manner. According to one embodiment, each bonding wire 506 is connected to its corresponding bonding pad 517 by a ball bond 532, and connected to its corresponding bonding pad 504 by a wedge bond 534. It is contemplated that any suitable type of wire bonding may alternatively be used. The bonding wires 506 for all dice 502 can be connected in a single manufacturing step, because the lateral offset of the dice 502 permits a wire bonding machine (not shown) to access all of the bonding pads 504. It is contemplated that this step may be omitted, in which case only the bonding pillars 507 would be provided. The process continues at step 1630.

At step 1630, the process ends and the MCP 500 is ready for further processing, including encapsulating the dice, bonding pillars, and bonding wires in a protective plastic molding compound or sealing the package by some other suitable method.

Figure 15:
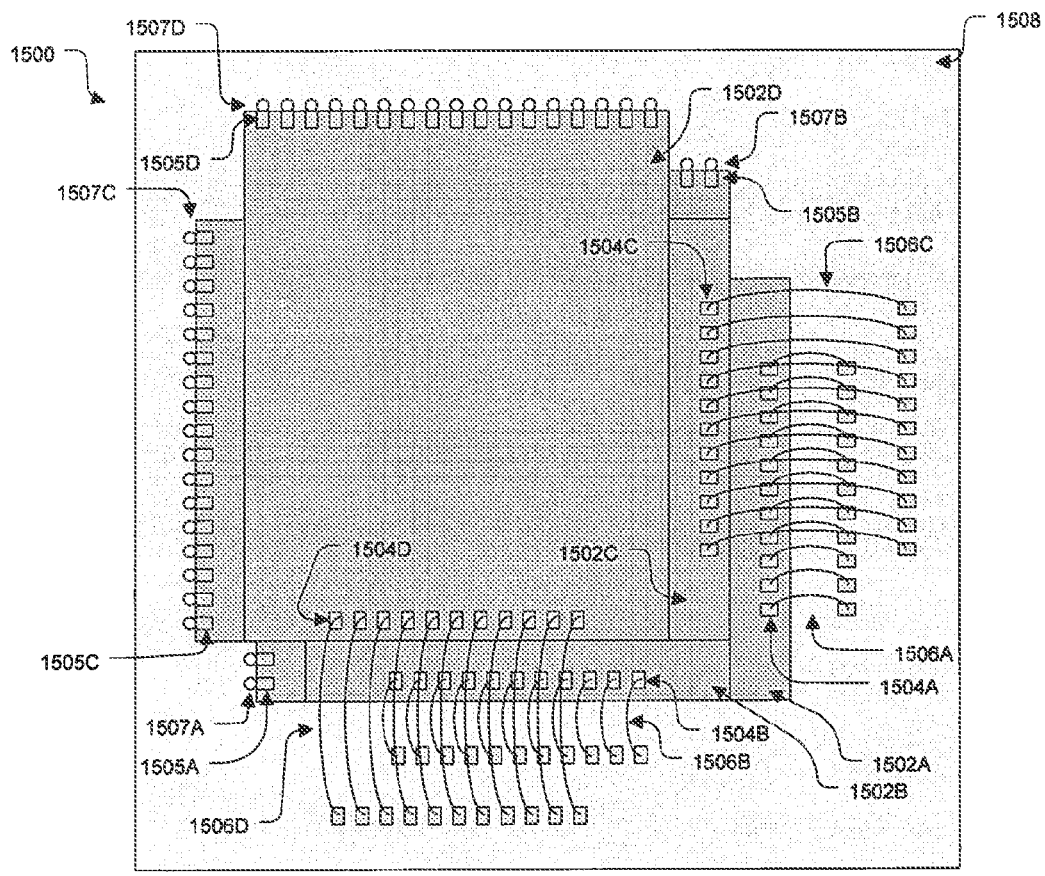
FIG. 15 is a schematic top plan view of a die stack with bonding pillars and bonding wires according to an alternative embodiment.

Referring to FIG. 15, according to an alternative embodiment the dice 1502A and 1502C are stacked in a first orientation, and the dice 1502B and 1502D are stacked in a second orientation perpendicular to the first orientation. In this arrangement, each die 1502 has bonding wires 1506 along a single edge and bonding pillars 1507 along a single edge opposite the bonding wires 1506. The alternating orientations of the dice 1502 result in the bonding wires 1506 and the bonding pillars 1507 each being distributed along two adjacent sides of the MCP 1500. In this arrangement, congestion is further reduced. In addition, the need for interposers is mitigated or eliminated because each die 1502 acts as a spacer between the two adjacent dice 1502 in the other orientation. For example, the thickness of the die 1502B creates a clearance between the adjacent dice 1502A and 1502C, which may provide a sufficient gap between the bonding pillars 1507A and the bottom of the die 1502C either by itself or with a thinner interposer than in the embodiment of FIG. 12. As a result, the height of the MCP 1500 can be reduced, or more dice 1502 can be stacked in an MCP 1500 that fits in a standard sized package. It should be understood that the method of assembling the MCP 1500 is substantially similar to the method of assembling the MCP 500, and therefore will not be discussed in detail.

Figure 17:
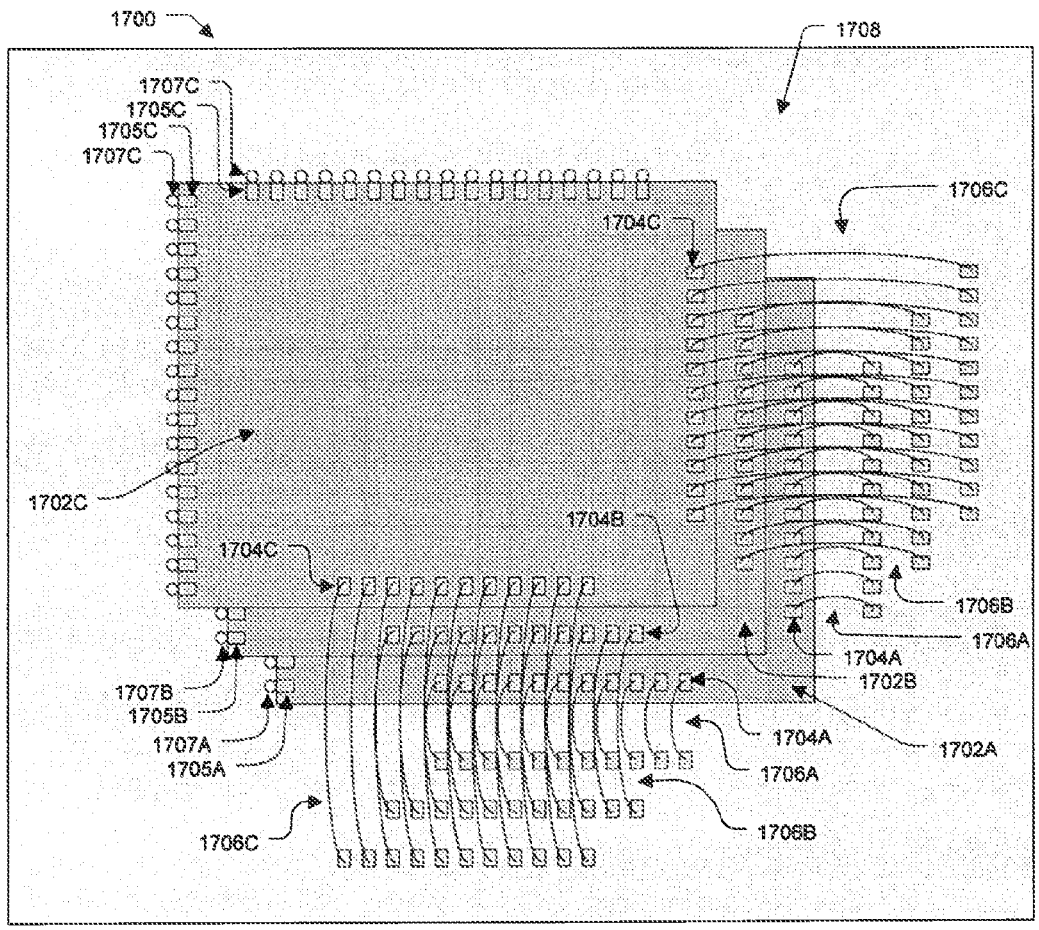
FIG. 17 is a schematic top plan view of a die stack with bonding pillars and bonding wires according to an embodiment.

Referring to FIG. 17, according to an alternative embodiment each die 1702 has bonding wires 1706 along two adjacent sides and bonding pillars 1707 along the remaining two adjacent sides. It is contemplated that each die 1702 may alternatively have no bonding wires 1706 attached, in which case only the bonding pillars 1707 would be provided along two sides. In this arrangement, interconnect congestion may be further reduced, or the number of bonding wires 1706 and bonding pillars 1707 for each die 1702 can be doubled while maintaining the same level of congestion. It should be understood that the method of assembling the MCP 1700 is substantially similar to the method of assembling the MCP 500 with the addition of second sets of bonding pads, bonding pillars and bonding wires, and therefore will not be discussed in detail.

Modifications and improvements to the above-described embodiments of the present invention may become apparent to those skilled in the art. The foregoing description is intended to be exemplary rather than limiting. The scope of the present invention is therefore intended to be limited solely by the scope of the appended claims.

The invention claimed is:
1. A semiconductor device, comprising:
a substrate having a first plurality of substrate bonding pads disposed on a bonding surface thereof;
a plurality of semiconductor dice disposed on the substrate, each die of the plurality of dice having a first plurality of die bonding pads arranged along at least one first edge thereof; and
a plurality of bonding pillars extending substantially vertically from the substrate bonding pads, each bonding pillar electrically connecting one of the first plurality of substrate bonding pads to a corresponding one of the first plurality of die bonding pads on a side surface of the plurality of semiconductor dice.

2. The semiconductor device of claim 1, wherein:
The substrate has a second plurality of substrate bonding pads disposed thereon;
each of the plurality of dice has a second plurality of die bonding pads arranged along at least one second edge thereof; and
further comprising a plurality of bonding wires electrically connecting each of the second plurality of substrate bonding pads to a corresponding one of the second plurality of die bonding pads.

3. The semiconductor device of claim 1, wherein:
the at least one first edge of at least one die of the plurality of dice overhangs the substrate bonding pads and the bonding pillars connected to at least one other die of the plurality of dice.

4. The semiconductor device of claim 3, wherein the at least one die of the plurality of dice is spaced apart from a top portion of the bonding pillars connected to at least one other die of the plurality of dice.

5. The semiconductor device of claim 1, further comprising interposers between consecutive ones of the plurality of dice.

6. The semiconductor device of claim 2, wherein:
the at least one first edge and the at least one second edge are opposite edges of the die.

7. The semiconductor device of claim 6, wherein:
each of the first plurality of die bonding pads is disposed on at least a lateral surface of the die.

8. The semiconductor device of claim 7, wherein:
each of the second plurality of die bonding pads is disposed on at least a top surface of the die.

9. The semiconductor device of claim 6, wherein:
the bonding pillars are connected to the substrate bonding pads via ball bonds.

10. The semiconductor device of claim 6, wherein:
the at least one first edge is a single first edge.

11. The semiconductor device of claim 10, wherein:
the at least one second edge is a single second edge.

12. The semiconductor device of claim 6, wherein:
the at least one first edge is two adjacent first edges.

13. The semiconductor device of claim 12, wherein:
the at least one second edge is two adjacent second edges.

* * * * *